(12) United States Patent
Hattori et al.

(10) Patent No.: US 8,020,136 B2
(45) Date of Patent: Sep. 13, 2011

(54) DEVICE AND METHOD FOR HIGH-LEVEL SYNTHESIS

(75) Inventors: Dai Hattori, Shiga (JP); Keiichi Kurokawa, Hyogo (JP)

(73) Assignee: Panasonic Corporation, Osaka (JP)

( * ) Notice: Subject to any disclaimer, the term of this patent is extended or adjusted under 35 U.S.C. 154(b) by 782 days.

(21) Appl. No.: 12/038,740

(22) Filed: Feb. 27, 2008

(65) Prior Publication Data

US 2008/0209380 A1    Aug. 28, 2008

(30) Foreign Application Priority Data

Feb. 28, 2007    (JP) ................................ 2007-049481

(51) Int. Cl.
*G06F 17/50*    (2006.01)

(52) U.S. Cl. ........................................ 716/132; 716/134
(58) Field of Classification Search ............ 716/132–135
See application file for complete search history.

(56) References Cited

U.S. PATENT DOCUMENTS

| | | | | |
|---|---|---|---|---|
| 6,295,636 | B1 * | 9/2001 | Dupenloup | 716/103 |
| 6,704,908 | B1 * | 3/2004 | Horan et al. | 716/104 |
| 6,832,363 | B2 * | 12/2004 | Ohnishi | 716/104 |
| 2002/0053069 | A1 | 5/2002 | Ohnishi et al. | |

OTHER PUBLICATIONS

Jerraya, A.A., et al., "Amical: An Interactive High Level Synthesis," Proceedings of European Conference on Design Automation, 1993.
Grotker, Thorsten et al., "System Design with System C," Kluwer Academic Publishers, 2002, pp. 40-48.

* cited by examiner

*Primary Examiner* — Jack Chiang
*Assistant Examiner* — Binh C Tat
(74) *Attorney, Agent, or Firm* — McDermott Will & Emery LLP

(57) ABSTRACT

A high-level synthesis unit creates a first register transfer level circuit from an operation level description. A circuit creating unit creates a second register transfer level circuit based on circuit information for creating an additional circuit to be added to the first register transfer level circuit. A circuit connecting unit connects the first register transfer level circuit with the second register transfer level circuit, based on connecting information describing a connecting relation between a signal in the first register transfer level circuit and a signal in the second register transfer level circuit.

14 Claims, 14 Drawing Sheets

F I G. 1
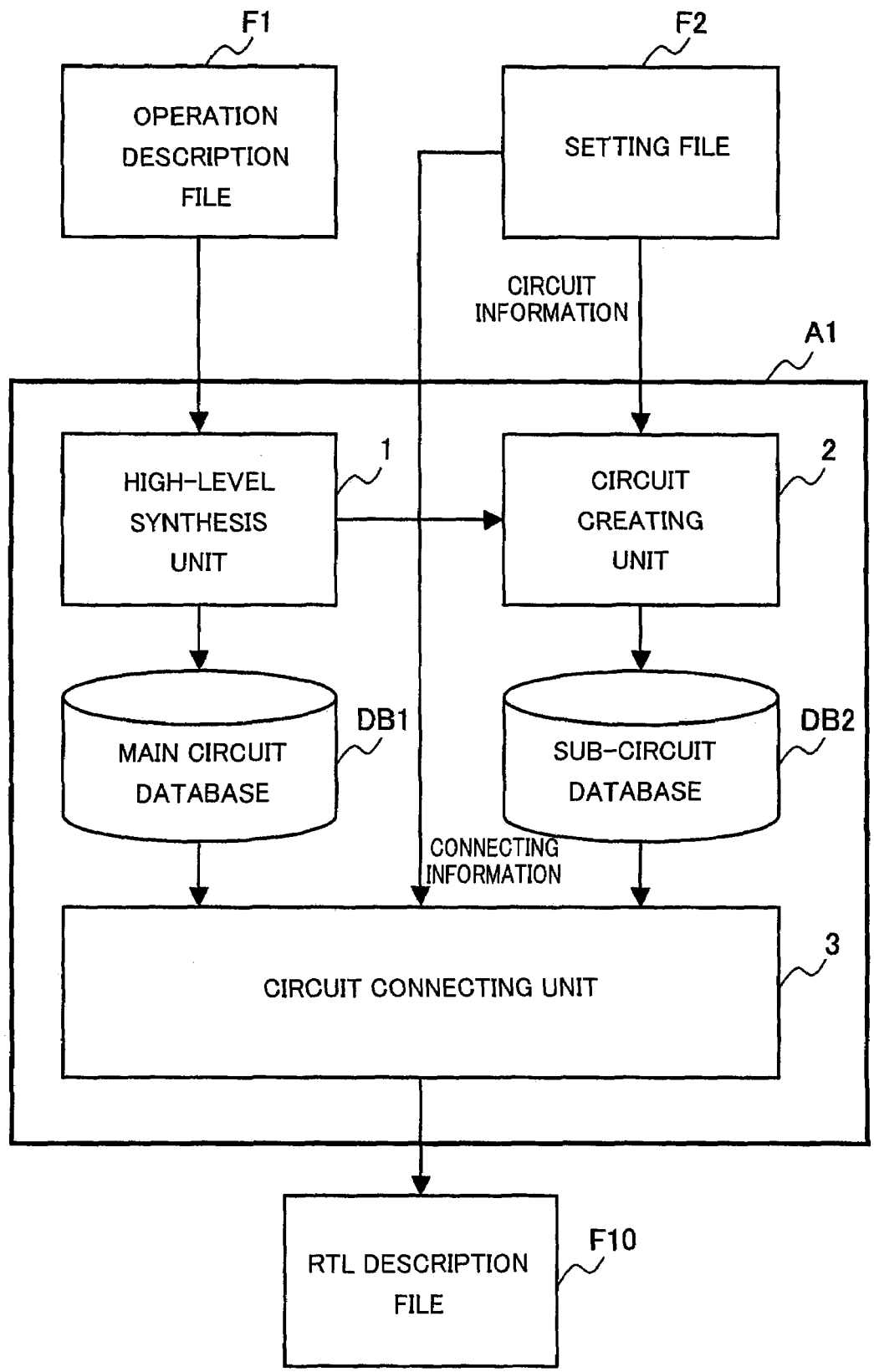

F I G. 2

```
1.   void f1 (int n, int *data1, int *data2) {
2.          int c1, c2;
3.          int ad, do;
4.          for ( c1 = 0; c1 < n; c1++ ) {
5.                  ad = c1+4;
6.                  do = base_data[ad];
7.                  data1[c1] =Y;
8.          }
9.          for ( c2 = 0; c2 < MAX; c2++ ) {
10.                 ad = c2 + 8;
11.                 do = base_data[ad];
12.                 data2[c2] = do;
13.         }
14.  }
15.
16.  void f2 (int *data, int *t) {
17.          int c;
18.          *t = 0;
19.          for (c = 0; c < 4; c++ ) {
20.                  *t += data[c];
21.          }
22.  }
23.
24.  void top (int n, int *t0, int *t1) {
25.          int data1[MAX], data2[MAX], t0, t1;
26.          f1(n, data1, data2);
27.          f2(data1, t0);
28.          f2(data2, t1);
29.  }
```

```
1.   module (f1) {
2.          output (DN) { DN = c1 == n; }           ~ x1
3.          input (ST) {}
4.          controller () {
5.                  start: ST;
6.          }
7.   }
8.
9.   module (f2) {
10.         input (ST) {}
11.         controller () {
12.                 start: ST;
13.         }
14.  }
15.
16.  module (f3) {
17.         input (f1_DN) {}
18.         output (f2_ST) { f2_ST = r0; }
19.         output (s0) { s0 = r1; }
20.         register (r0) {                          ~ x2
21.                 r0 = f1_DN;
22.                 delay: cycle(f1.ad, f1.do) - 1;
23.         }
24.         register (r1) {                          ~ x3
25.                 if ( f1_DN ) r1 = ~r1;
26.                 reset: 0;
27.         }
28.  }
29.
30.  module (top) {
31.         instance (f3) { module: f3; }            ~ x4
32.         wire (n0) {
33.                 f3.f1_DN = f1.DN;                ~ x5
34.         }
35.         wire (n1) {
36.                 f2.ST = f3.f2_ST;                ~ x6
37.         }
38.         select (f2) {condition: f3.s0; }         ~ x7
39.  }
```

F2

FIRST REGISTER TRANSFER LEVEL CIRCUIT
(MAIN CIRCUIT DATABASE DB1)

SECOND REGISTER TRANSFER LEVEL CIRCUIT
(SUB-CIRCUIT DATABASE DB2)

F I G. 5
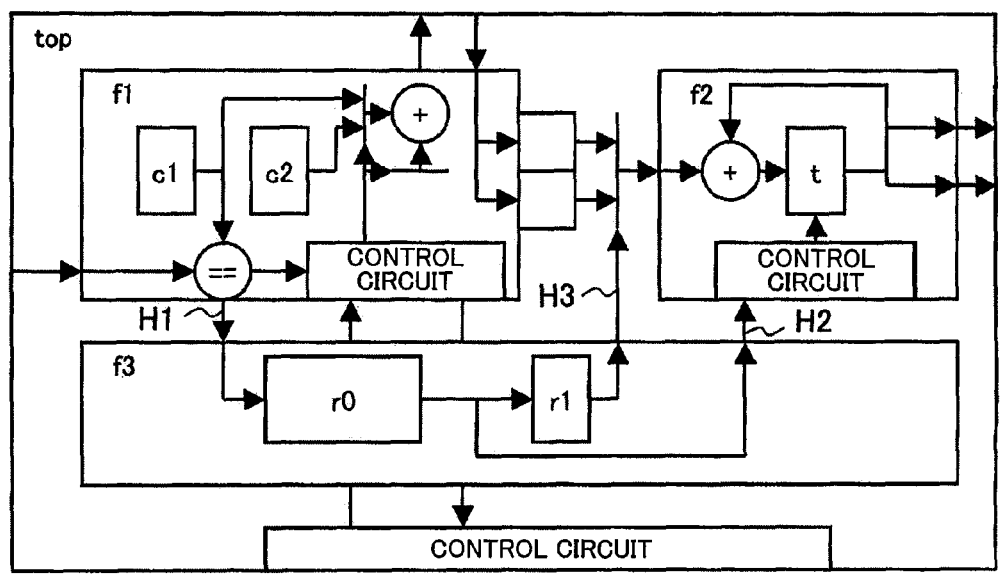
RTL DESCRIPTION FILE F10

F I G. 6
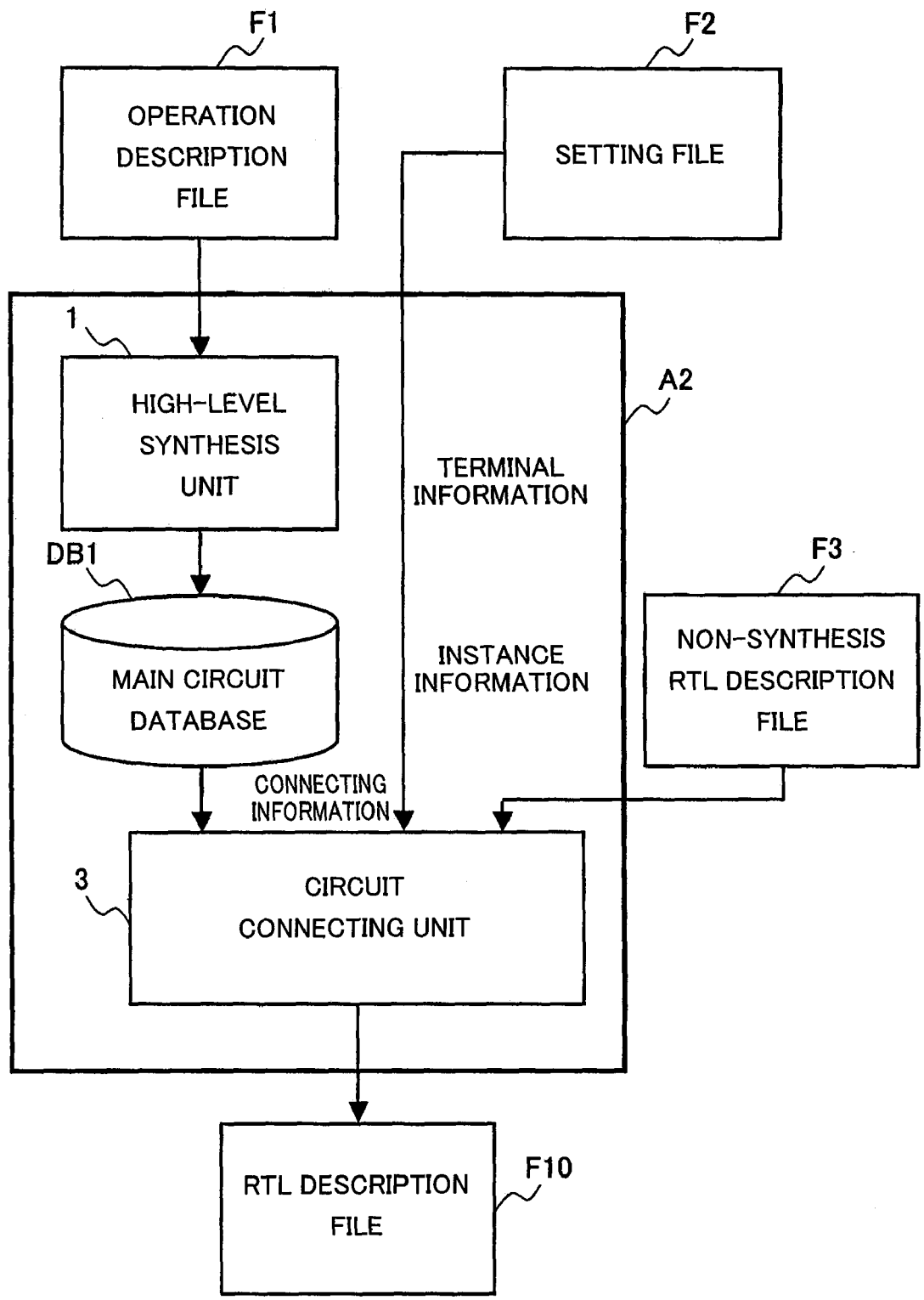

```
1.   module (top) {
2.           input (test_mode) {}
3.           input (base_data_do) {}
4.           output (base_data_di) {
5.                   base_data_di = f3.di;              ~ y1
6.           }
7.           output (base_data_ad) {
8.                   base_data_ad = f3.ad;
9.           }
10.          instance (f3) { rtl_module: f3; }          ~ y2
11.          wire (n0) {
12.                  f3.test_mode = test_mode;
13.          }
14.          wire (n1) {
15.                  f3.ad_in = f1.base_data_ad;
16.          }
17.          wire (n2) {                                 ~ y3
18.                  f1.base_data_do = f3. do_out;
19.          }
20.          wire (n3) {
21.                  f3.do = base_data_do;
22.          }
23.  }
```

```
1.   module f3 ( test_mode, ad, di, do, ad_in, do_out );
2.   input test_mode;
3.   output [3:0] ad;
4.   output [7:0] di;
5.   input [7:0] do;
6.   input [3:0] ad_in;
7.   output [7:0] do_out;
8.   ...
9.   endmodule
```

F I G. 8

```
1.   module top (clk, nrst, n, t0, t1,
2.     test_mode, base_data_ad, base_data_do, base_data_di);
3.   input clk;
4.   input nrst;
5.   input [31:0] n;
6.   output [31:0] t0;
7.   output [31:0] t1;
8.
9.   input test_mode;
10.  output [3:0] base_data_ad;
11.  input [7:0] base_data_do;         ~ z1
12.  output [7:0] base_data_di;
13.
14.  wire [3:0] n1;        ~ z2
15.  wire [7:0] n2;
16.
17.  f1 f1 ( .clk(clk), .nrst(nrst), .n(n), .data1(data1), .data2(data2),
18.    .base_data_ad(n1), .base_data_do(n2) );
19.
20.  f3 f3 ( .clk(clk), .nrst(nrst), .test_mode(test_mode),
21.    .ad(base_data_ad), .di(base_data_di), .do(base_data_do),  ~ z3
22.    .ad_in(n1), .do_out(n2) );
23.
24.  ...
25.
26.  endmodule
```

F10

F I G. 9
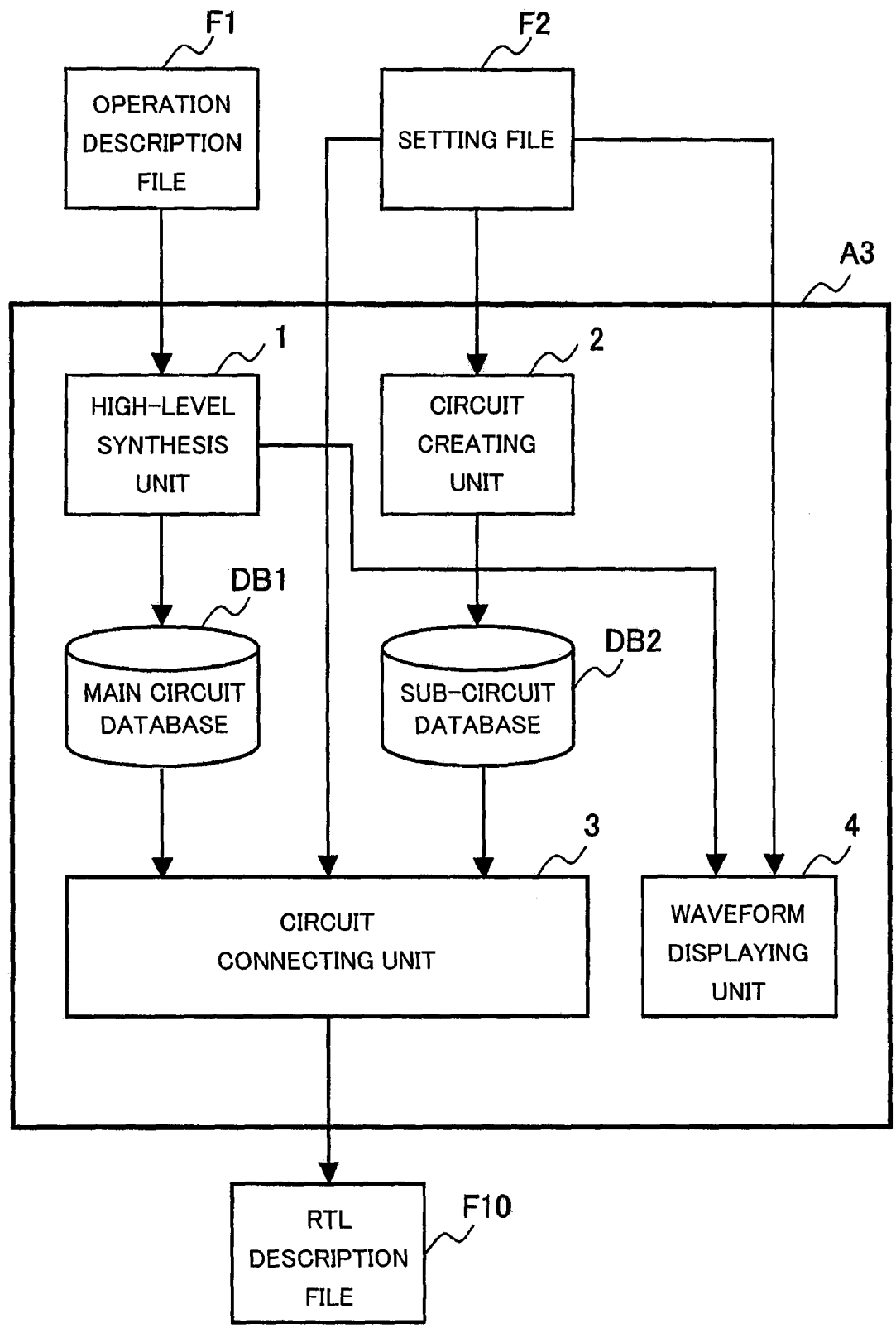

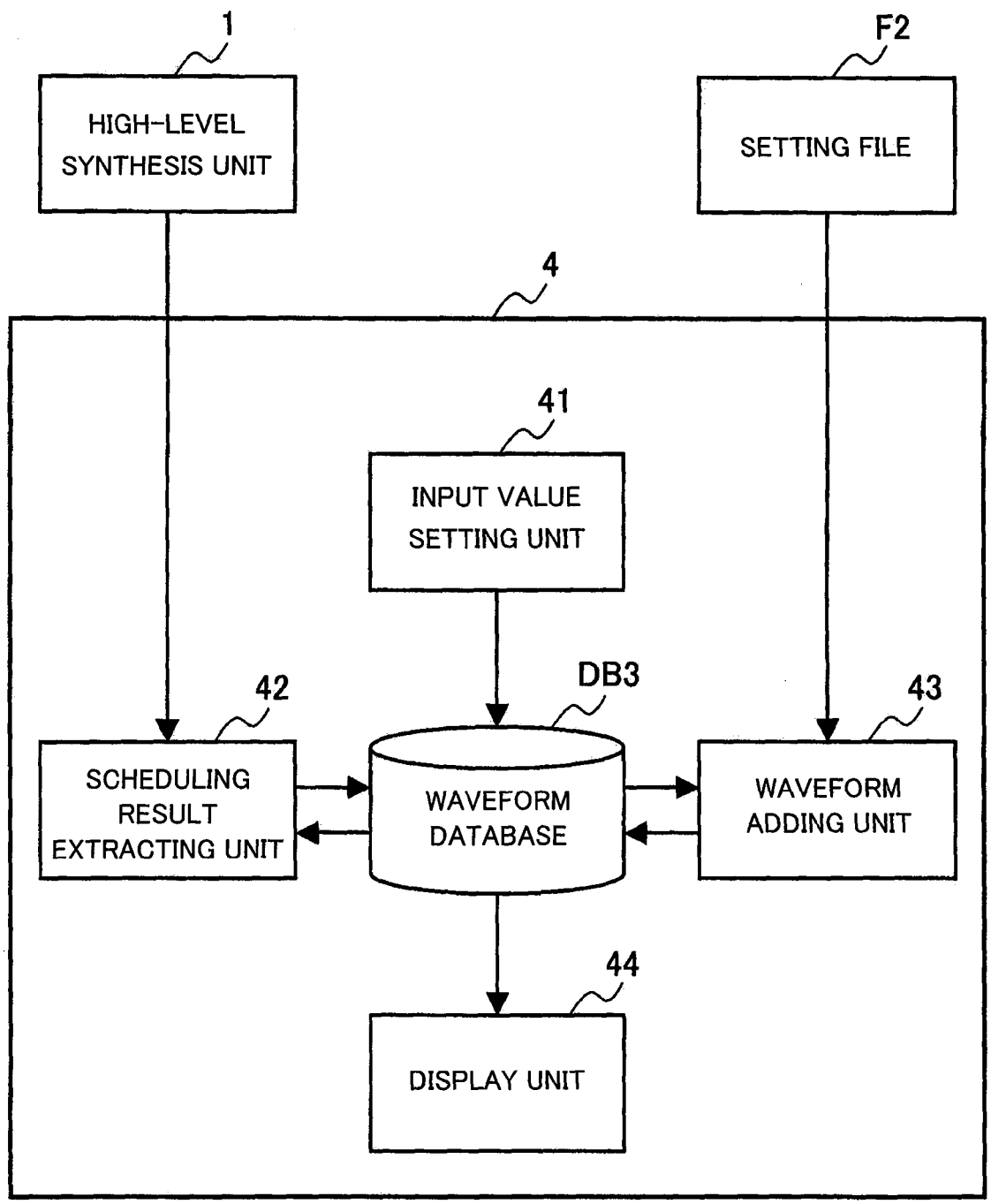
F I G. 1 0

F I G. 1 1
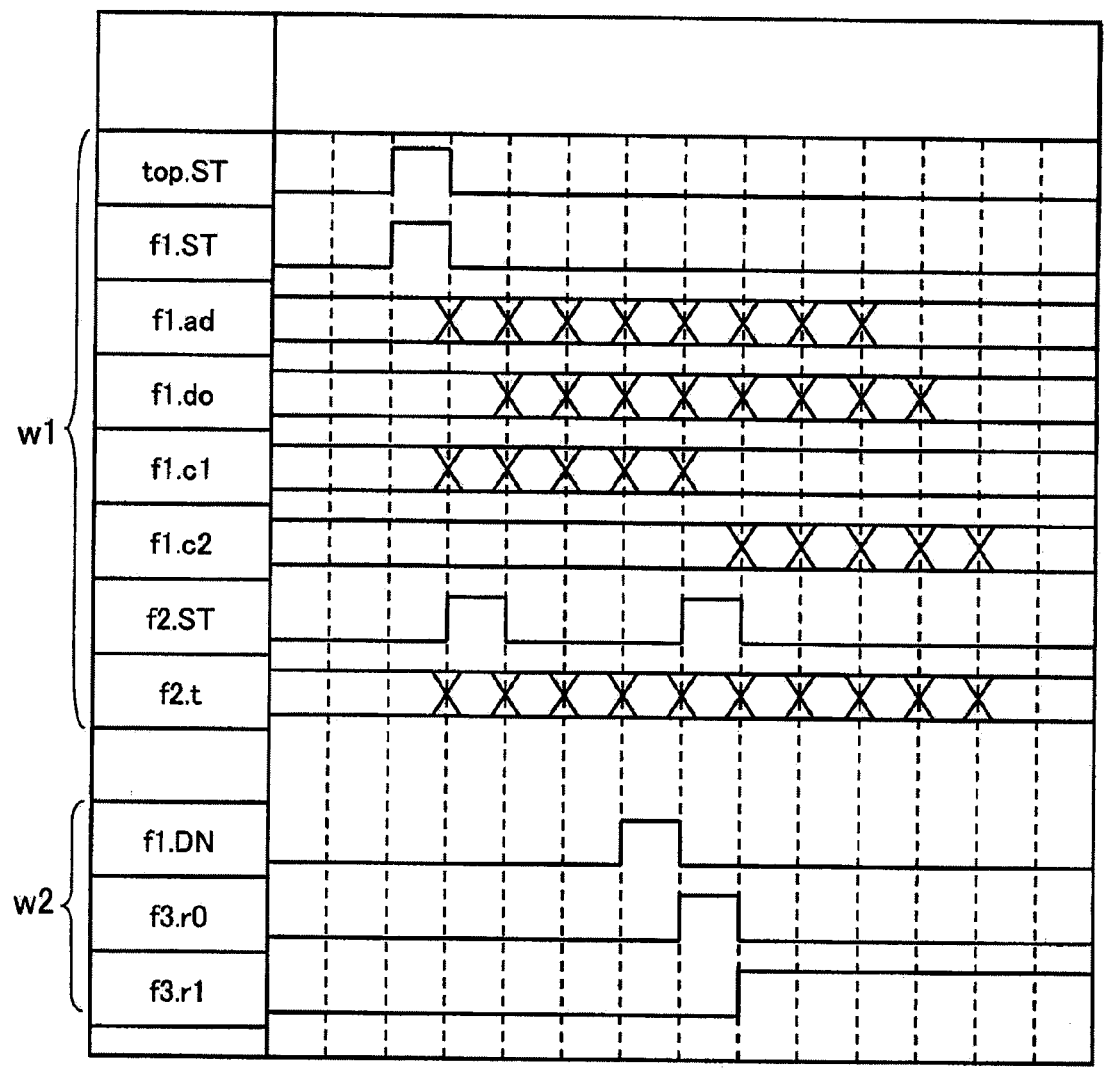

F I G . 1 2
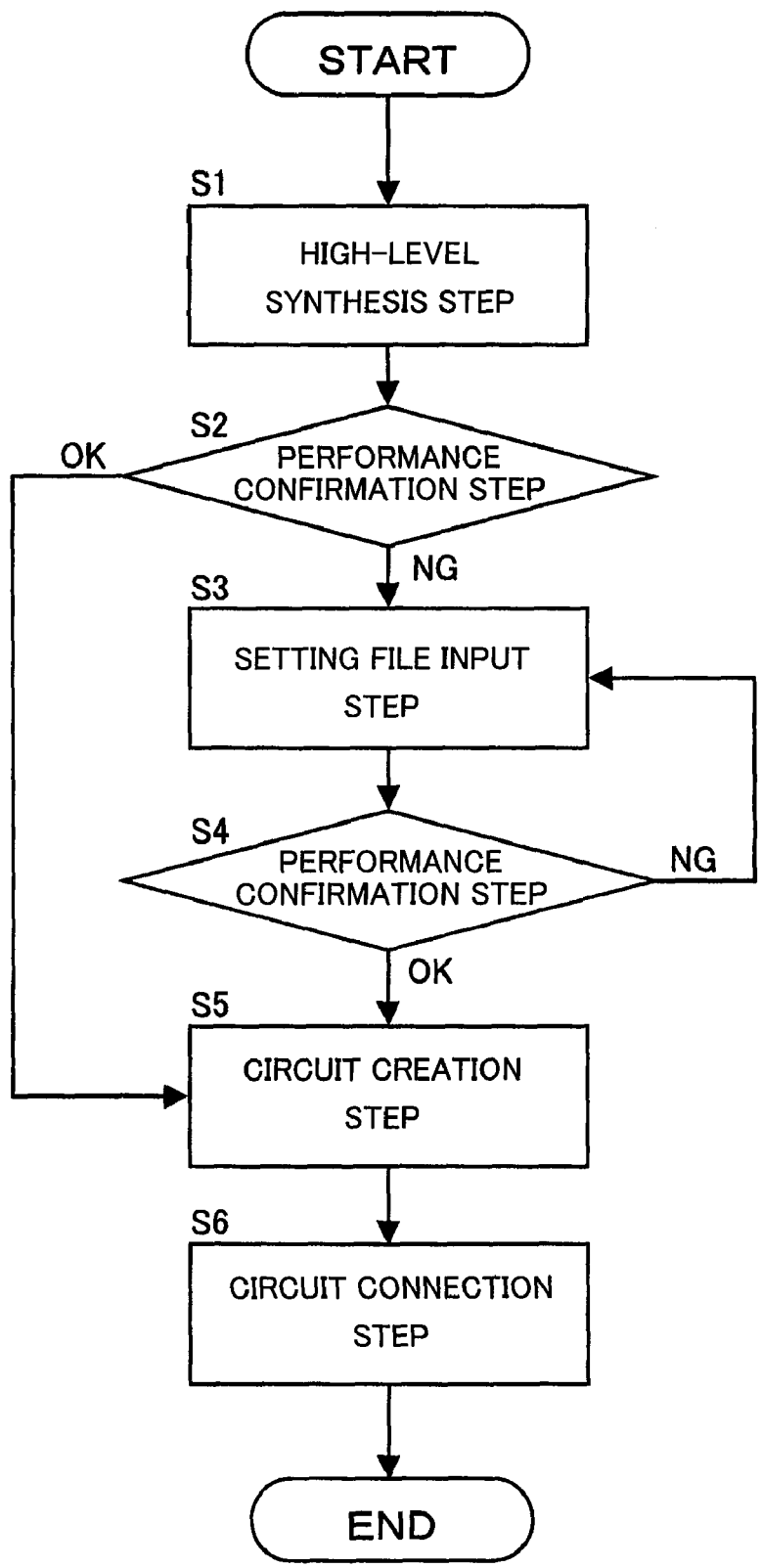

F I G. 1 4 A
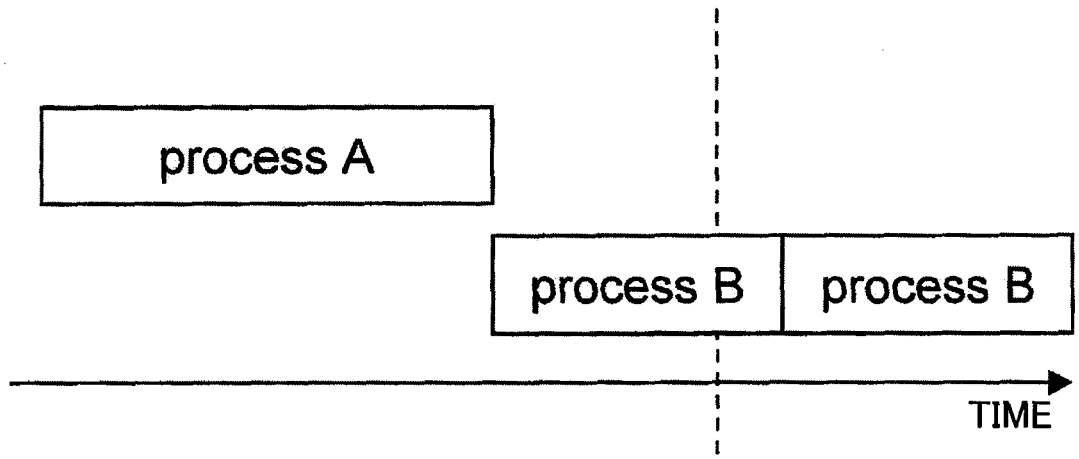
F I G. 1 4 B
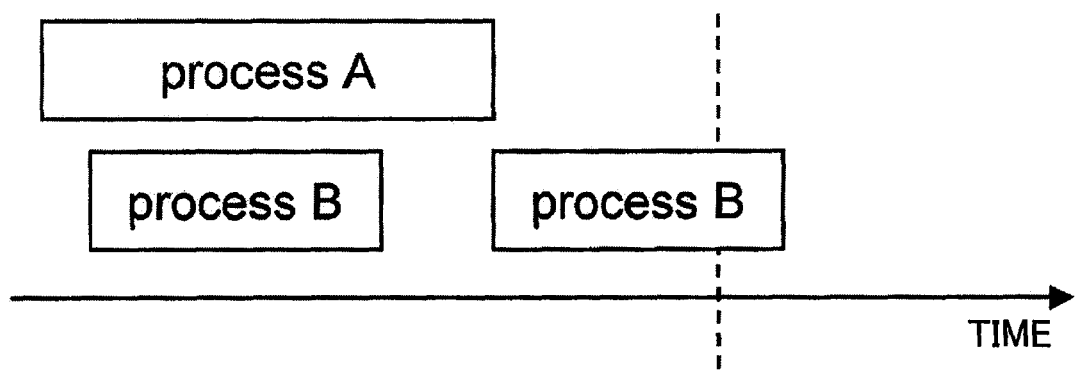
F I G. 1 4 C
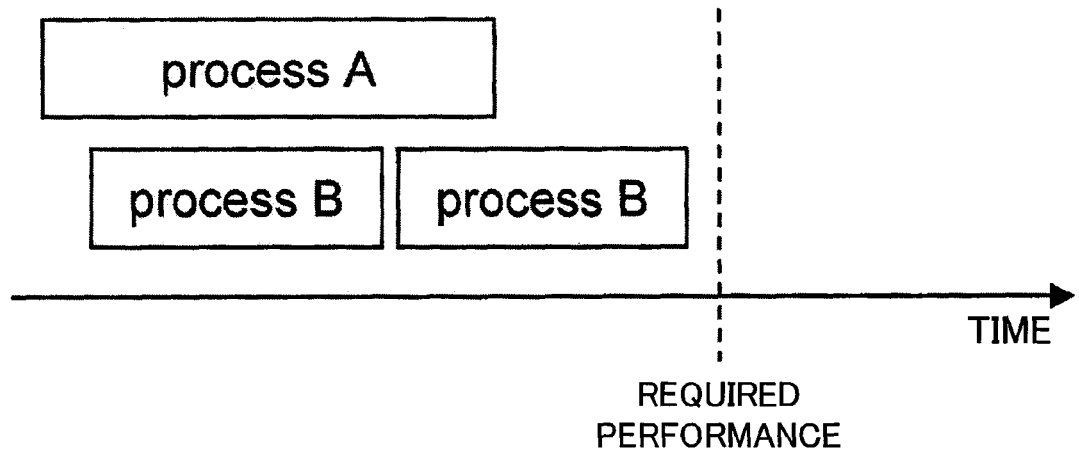
REQUIRED PERFORMANCE

DEVICE AND METHOD FOR HIGH-LEVEL SYNTHESIS

BACKGROUND OF THE INVENTION

1. Field of the Invention

The present invention relates to a device and a method for high-level synthesis for outputting a register transfer level description with an operation level description of a circuit as an input.

2. Description of the Related Art

In designing an LSI, an efficient LSI design technique is required, in accordance with a scale increase of the LSI in recent years. Therefore, such a technique is used as to describe a circuit at an operation level with relatively smaller description quantity than that of a register transfer level, and thereafter to synthesize a register transfer level circuit by a high-level synthesis tool.

In an operation level description, the operation of a circuit is described as sequential processing, by using a programming language such as C language. A register transfer level description is generated from such an operation level description by a high-level synthesis tool. Generally, in the high-level synthesis, processes of a flowchart shown in FIG. 13, as will be described hereinafter, are executed.

Specifically, first, in scheduling step S11, the operation description described as sequential processing is inputted, scheduling of arithmetic operations is then made for improving processing performance, and a method of parallel processing is determined. A data flow graph (DFG), in which a dependence relation between data and arithmetic operations is expressed by a graph, is used in the scheduling.

Next, in resource sharing step S12, in order to reduce a circuit area, sharing of a resource for executing the arithmetic operation in the description of the operation level is performed. The input of the resource at this time is the input according to the arithmetic operation in the operation level description, and therefore a selector for controlling the input of the resource is required.

Finally, in control circuit creation step S13, a control circuit required for realizing the scheduling result is created, and thereafter this control circuit and a data path showing a connection form of the resource are outputted to the outside as a register transfer level (RTL) description.

As described above, dependence analysis of the original operation description is performed, and the data flow graph is extracted through the analysis; however, when the dependence relation of data is complicated for the reason that the operation content of the operation level description is changed by an input value, it is not always possible to perform the dependence analysis for extracting only minimum required data dependence. In such a case, a scheduling result expected by a user cannot be obtained.

In addition, since processing performance of the register transfer level circuit is determined by the scheduling, in some cases, the register transfer level circuit satisfying required performance cannot be created. In such a case, as is proposed in Document 1 (A. A. JERRAYA, I. PARK, K. O'BRIEN, "AMICAL: AN INTERACTIVE HIGH LEVEL SYNTHESIS", Proceedings of European Conference on Design Automation, 1993), there is a method of performing scheduling in which a user satisfies required performance by using a mechanism capable of changing the scheduling. However, the method of creating the control circuit for operating the circuit according to the scheduling result has a limitation because it depends on the tool. Consequently, the scheduling changeable by the user has a limitation.

In addition, as another method, there is a technique of partially determining the scheduling at the stage of operation level description and reducing the scheduling part by a high-level synthesis tool. FIGS. 14A to 14C are diagrams schematically illustrating the scheduling, and FIG. 14A illustrates a processing relation in the sequential operation. FIG. 14B illustrates a processing relation in the scheduling result of the high-level synthesis. When the processing relation required by the user is as shown in FIG. 14C, what is shown in FIG. 14C should be described in advance in the operation level description (change of the operation level description).

However, in order to express the operation of FIG. 14C, a process A and a process B are required to be expressed as parallel processes. In such a case, a language capable of describing the parallel processes as proposed in Document 2 (Thorsten Grotker, Stan Liao, Grant Martin, Stuart Swan, translated by Masaru Kakimoto, Masamichi Kawarabayashi, Takashi Hasegawa, "System C ni yoru system sekkei" (System design by System C), Maruzen, January 2003) is used. When the operation level circuit is described by using such a language, the mechanism for performing simulation of the parallel processes is required for performing operation verification of the operation level description. Further, since the operation level description is a description in which timing should be considered, the operation level description itself may become complicated in some cases.

As is disclosed in US2002/0053069, when a system is operated by a specific protocol, there is a method in which information regarding the timing is held as a library, with the operation level description defined as a description in which timing is not considered, and the scheduling is made by the high-level synthesis tool based on the timing defined tool in the library. In this case, a circuit that can be applied needs to operate in accordance with a predetermined protocol.

In a case that the synthesis of the register transfer level description is performed based on the operation level description, if the required performance is not satisfied by the circuit synthesized by the high-level synthesis tool, a mechanism that allows the user to intervene in the scheduling is provided in a conventional method, but the range that can be controlled by the user is limited. In this case, therefore, the required performance cannot be sufficiently satisfied after all.

In addition, conventionally, there is a method (change of the operation level description) in which the user determines the scheduling at the stage of operation level description. However, in this method, a special mechanism is required for verifying the operation of the operation level description, and moreover, the operation level description is complicated, so that there is a possibility that the design efficiency deteriorates.

Further, conventionally, there is a method of setting the information regarding the timing as a library, without changing the operation level description. However, in this method, the applicable range is limited, and in this case also, the required performance cannot be sufficiently satisfied.

SUMMARY OF THE INVENTION

Accordingly, a main object of the present invention is to create a register transfer level description by using a control circuit capable of realizing scheduling designed by a user without changing an operation level description.

The present invention provides a high-level synthesis device for creating a register transfer level circuit from an operation level description, including a high-level synthesis unit that creates a first register transfer level circuit from the operation level description; a circuit creating unit that creates a second register transfer level circuit based on circuit information for creating an additional circuit to be added to the first register transfer level circuit; and a circuit connecting unit that connects the first register transfer level circuit with the second register transfer level circuit, based on connecting information describing a connecting relation between a signal in the first register transfer level circuit and a signal in the second register transfer level circuit.

In this configuration, the high-level synthesis unit only creates the first register transfer level circuit based on the operation level description and does not change the operation level description. The second register transfer level circuit relating to the additional circuit of the register transfer level as an element required for satisfying required performance is created by the circuit creating unit of a system different from the system of the original high-level synthesis unit. The circuit connecting unit connects the first register transfer level circuit with the second register transfer level circuit. In this connection, the connecting information describing the connecting relation between the signal in the first register transfer level circuit and the signal in the second register transfer level circuit is used.

According to the present configuration, a register transfer level circuit using the control circuit capable of realizing a scheduling result designed by a user is created without changing the operation level description. Therefore, a register transfer level circuit capable of satisfying the required performance can be obtained.

In addition, the present invention provides a high-level synthesis device for creating a register transfer level circuit from an operation level description, including a high-level synthesis unit that creates a first register transfer level circuit from the operation level description; and a circuit connecting unit that connects the first register transfer level circuit with a second register transfer level circuit, based on connecting information describing a connecting relation between a signal in the first register transfer level circuit and a signal in the second register transfer level circuit that is different from the first register transfer level circuit.

In this configuration, the circuit creating unit is not provided. The second register transfer level circuit here is a non-synthesis circuit. Even in this case, it is possible to create an RTL description that satisfies the required performance, without changing the operation level description, in the same way as described above, by using the control circuit designed by the user. Accordingly, it is possible to reduce description errors, as compared to a case of manually adding correction to an RTL circuit created by high-level synthesis.

The high-level synthesis device according to the present invention has an aspect in which the device further includes a waveform displaying unit that creates and displays a signal transition waveform based on a value of a signal inputted in the first register transfer level circuit, a scheduling result of the high-level synthesis unit, and the circuit information.

By this configuration, the user can confirm a transitional relation between the signal of the circuit created by the high-level synthesis and the signal of the circuit designed by the user. Therefore, it is possible to confirm whether the circuit information inputted by the user is information by which a circuit that performs operation as intended can be created.

In addition, the present invention provides a method for high-level synthesis which is a method of creating a register transfer level circuit from an operation level description, including the steps of creating a first register transfer level circuit from the operation level description; determining whether the first register transfer level circuit satisfies prescribed required performance; receiving input of circuit information for creating an additional circuit to be added to the first register transfer level circuit to satisfy the required performance and connecting information describing a connecting relation between signals in the first register transfer level circuit including the additional circuit in a case where it is determined that the first register transfer level circuit does not satisfy the required performance; determining whether the first register transfer level circuit including the additional circuit satisfies the required performance, by referring to the first register transfer level circuit and the circuit information; creating a second register transfer level circuit based on the circuit information, in a case where it is determined that the first register transfer level circuit including the additional circuit satisfies the required performance; and creating a target register transfer level circuit by connecting the first register transfer level circuit with the second register transfer level circuit, based on the connecting information.

According to the present invention, it is possible to create a register transfer level circuit using a control circuit capable of realizing the scheduling result designed by a user, without changing the operation level description. Accordingly, it is possible to obtain a register transfer level circuit that satisfies required performance.

The high-level synthesis device according to the present invention has a characteristic of creating a register transfer level description using a control circuit designed by a user without changing the operation level description, thus the present invention is useful in LSI design in which complicated control is required to satisfy the required performance.

BRIEF DESCRIPTION OF THE DRAWINGS

Other objects of the present invention will become apparent by understanding preferred embodiments as will be described hereinafter, and will be clarified in the claims appended herewith. Numerous advantages that are not described herein will be understood by those skilled in the art when the present invention is implemented.

FIG. 1 is a block diagram of a high-level synthesis device according to a first embodiment of the present invention;

FIG. 2 is a diagram illustrating a description example of an operation description file according to the first embodiment of the present invention;

FIG. 3 is a diagram illustrating a description example of a setting file according to the first embodiment of the present invention;

FIG. 5 is a diagram illustrating a circuit example created by a circuit connecting unit according to the first embodiment of the present invention;

FIG. 6 is a block diagram of a high-level synthesis device according to a second embodiment of the present invention;

FIG. 7A is a diagram illustrating a description example of a setting file according to the second embodiment of the present invention;

FIG. 7B is a diagram illustrating a description example of a non-synthesis RTL description file according to the second embodiment of the present invention;

FIG. 8 is a diagram illustrating a description example of a target RTL description file according to the second embodiment of the present invention;

FIG. 9 is a block diagram of a high-level synthesis device according to a third embodiment of the present invention;

FIG. 10 is a block diagram of a waveform displaying unit according to the third embodiment of the present invention;

FIG. 11 is a diagram illustrating a display example of the waveform displaying unit according to the third embodiment of the present invention;

FIG. 12 is a flowchart illustrating processing procedures of a high-level synthesis method according to the third embodiment of the present invention;

FIGS. 14A to 14C are diagrams illustrating relations of processing time.

DETAILED DESCRIPTION OF THE INVENTION

Figure 4A:
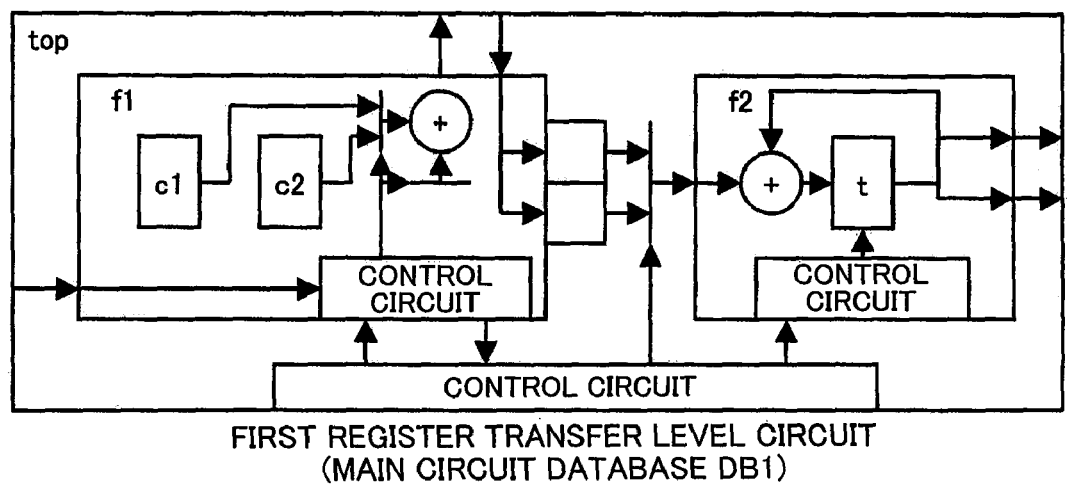
FIGS. 4A and 4B are diagrams illustrating a circuit example to be stored in main/sub circuit databases according to the first embodiment of the present invention.

Preferred embodiments of a device and a method for high-level synthesis according to the present invention will be described in detail with reference to the drawings.

First Embodiment

FIG. 1 is a block diagram of a high-level synthesis device according to a first embodiment of the present invention. A high-level synthesis device A1 includes a high-level synthesis unit 1, a circuit creating unit 2, and a circuit connecting unit 3. The high-level synthesis unit 1 creates a first register transfer level (RTL) circuit from an operation description file F1 and stores the same in a main circuit database DB1. The circuit creating unit 2 creates a second register transfer level (RTL) circuit from a setting file F2 and stores the same in a sub-circuit database DB2. The circuit connecting unit 3 creates a target RTL description file F10 for connecting the first RTL circuit of the main circuit database DB1 and the second RTL circuit of the sub-circuit database DB2, in accordance with a connecting method described in the setting file F2.

The operation description file F1 is a file describing the operation of a circuit to be designed and is an input file of the high-level synthesis device A1. The operation description file F1 is described in a programming language such as C language. The setting file F2 is an input file of the high-level synthesis device A1. The setting file F2 is a file describing circuit information and connecting information. The circuit information us used herein is information necessary for creating an RTL circuit designed by a user, and the connecting information as used herein is information necessary for connecting a signal of the first RTL circuit in the main circuit database DB1 and a signal of the second RTL circuit in the sub-circuit database DB2.

The target RTL description file F10 is a file describing the circuit at a register transfer level, and the RTL description file F10 is an output file of the high-level synthesis device A1. The RTL description file F10 is described in a hardware description language such as Verilog-HDL language. The main circuit database DB1 is a database storing the first RTL circuit created from the operation description file F1 through high-level synthesis of the high-level synthesis unit 1. The sub-circuit database DB2 is a database storing the second RTL circuit created from the circuit information described in the setting file F2 by the circuit creating unit 2. The main circuit database DB1 and the sub-circuit database DB2 store the RTL circuits as intermediate representation. The intermediate representation is a representation of information equivalent to contents described in the target RTL description file F10 and additional information created by the high-level synthesis unit 1. The high-level synthesis unit 1 creates the first RTL circuit from the operation description file F1 by a method equivalent to the conventional method and thereafter stores the created first RTL circuit in the main circuit database DB1.

Next, an operation example of the circuit creating unit 2 will be described. FIG. 2 is a description example of the operation description file F1, and FIG. 3 is a description example of the setting file F2. The setting file F2 is described in the same unit as that of a module described in the target RTL description file F10. Described in the setting file F2 are terminal information for creating terminals other than the terminal of the module created by the high-level synthesis unit 1 from the operation description file F1, signal information of the control circuit created by the high-level synthesis unit 1, circuit information created by the circuit creating unit 2, and connecting information for use in the circuit connecting unit 3.

An module statement (lines 1, 9, 16, 30) designates a target module name. An input/output statement (lines 2, 3, 10, 17 to 19) is terminal information by which a terminal name is designated. When the designated terminal name is an output terminal (output), logic of input of the terminal is described in the output statement. At that time, the logic is described by an assignment statement, with the left side as the terminal name. A controller statement (lines 4/11) shows the control circuit to be created by the high-level synthesis unit 1, and a start statement (lines 5, 12) shows that a start signal of the control circuit has a signal name ST. A register statement (lines 20, 24) shows that a delay circuit is created, and further designates a signal name of an output of the delay circuit. In the register statement, logic of input of the delay circuit and a writing condition of the delay circuit (lines 21/25) are described. At that time, the logic and the condition are described with an assignment statement with the left side as an output signal name. A delay statement (line 22) designates a delay amount of the delay circuit. In a reset statement (line 26), a value at the time of reset operation is designated. In the formula indicating the delay amount, the delay amount in the scheduling result of the high-level synthesis unit 1 is referred to by using a cycle function. An instance statement (line 31) shows that an instance of a module f3 is created, with the name set as an instance name f3. A wire statement (lines 32, 35) shows that a combination circuit is created. Specifically, the wire statement (lines 32, 35) shows that the left side and the right side of the assignment statement are connected. A select statement (line 38) shows that an output terminal s0 of the instance f3 is connected as a control signal of a selector, in the case where the selector is created through resource sharing as an input signal of an instance f2.

The signal described in the operation description file F1 or the signal defined by the setting file F2 is used as the signal referred to by the combination logic which is the right side of the assignment statement in the setting file F2. The output signal of the circuit created by the circuit creating unit 2 or the signal of the control circuit created by the high-level synthesis unit 1 indicates the signal defined by the setting file F2. The combination logic is described as a formula using arithmetic, logic, and conditional operators. For example, when the RTL description file, which is the output, is in Verilog-HDL, the operator defined in the Verilog-HDL is used.

Figure 4B:
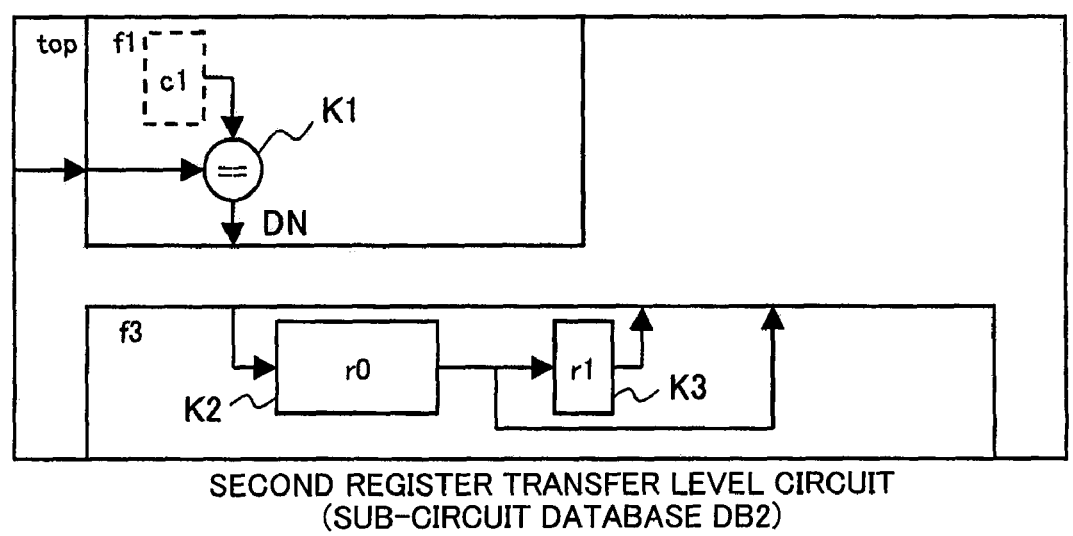
Figure 13:
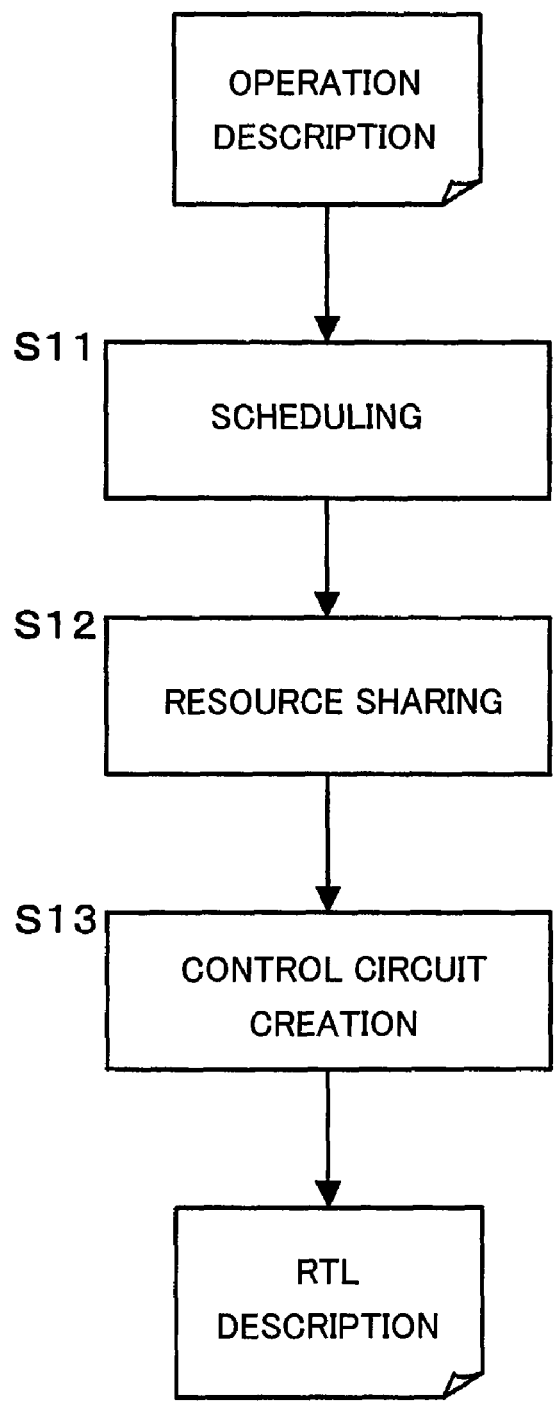
FIG. 13 is a flowchart illustrating processing procedures of a high-level synthesis method by a conventional technique.

Based on the circuit information described in the setting file F2, the circuit creating unit 2 creates the second RTL circuit and stores the information of the created second RTL circuit in the sub-circuit database DB2. FIG. 4B shows an example of the second RTL circuit created based on the setting file F2.

A combination circuit K1 for creating the output signal is created from a combination logic description x1 of the output statement. An output terminal DN designated by the output statement is created as a terminal of the module f1. A delay circuit K2 is created from a register statement description x2.

A delay circuit K3 is created from a register statement x3. In the delay circuit K2, the input signal becomes f1_DN, and the delay cycle from the input signal to the output signal becomes equal to the delay cycle from a signal ad to a signal do of the module f1 in the main circuit database DB1. In the case where the delay cycle from the signal ad to the signal do is 2 cycles, the delay from the input to the output in the delay circuit K2 becomes 1 cycle. The delay circuit K3 is a register which is set to 0 at the time of reset, and when the input signal f1_DN is 1, the register value is updated.

Next, the operation example of the circuit connecting unit 3 will be described. FIGS. 4A, 4B, and 5 show examples of the circuits to be created, where FIG. 4A shows the first RTL circuit to be stored in the main circuit database DB1, FIG. 4B shows the second RTL circuit to be stored in the sub-circuit database DB2, and FIG. 5 shows the "target RTL circuit" to be outputted to the "target RTL description file F10".

A signal c1 in the module f1 is a signal created by the main circuit database DB1 and also is a signal referred to from the sub-circuit database DB2. Because of such a signal form, the signal c1 of the main circuit database DB1 and the signal c1 of the sub-circuit database DB2 are regarded as the same signals and are connected with each other.

In a module top, the instance f3 of the module f3 is created as a circuit in the module top based on an instance statement x4. Wiring H1 between the module f1 and the module f3 and wiring H2 between the module f2 and the module f3 are formed from wire statements x5/x6. A select statement x7 is a description indicating a selector to be created at the time of resource sharing of the module f2. The condition statement shows that the control signal of the selector is a terminal s0 of the instance f3. Based on the description of the condition statement, wiring H3 of the control signal of a resource sharing selector of the module f2 is connected to the terminal s0 of the instance f3.

The circuit connecting unit 3 determines a bit width of the wirings H1/H2/H3 created for the connection between signals, based on the bit widths of the signal of the main circuit database DB1 and the signal of the sub-circuit database DB2. The circuit connecting unit 3 outputs the circuit shown in FIG. 5 and obtained by the connection, as the target RTL description file F10.

As described above, in the high-level synthesis device according to the present embodiment, by describing in the setting file F2 the information for creating the control circuit capable of realizing the scheduling designed by a user, the RTL description that satisfies the required performance can be created without changing the operation level description.

In addition, even when the control circuit that the user wants to create depends on the scheduling result of high-level synthesis, the creation method of the control circuit can be designated by using a value calculated from the result of high-level synthesis. Therefore, a control circuit capable of relatively controlling the RTL circuit created by high-level synthesis can be created. Further, the selector created in association with the resource sharing can be controlled from the control circuit designed by the user, so that a resource sharing function of the high-level synthesis can be used.

Second Embodiment

FIG. 6 is a block diagram of a high-level synthesis device according to a second embodiment of the present invention. In FIG. 6, the same reference numerals are assigned to the same components as those in FIG. 1 of the first embodiment.

A high-level synthesis device A2 includes a high-level synthesis unit 1 and a circuit connecting unit 3. The high-level synthesis unit 1 creates a first RTL circuit from an operation description file F1 and stores the same in a main circuit database DB1. In accordance with the connecting information described in a setting file F2, the circuit connecting unit 3 adds to the first RTL circuit in the main circuit database DB1 an instance for calling a non-synthesis RTL circuit described in a non-synthesis RTL description file F3 and creates a target RTL description file F10. In the present embodiment, the circuit creating unit 2 according to the first embodiment is not provided. The non-synthesis RTL description file F3 is a file describing the circuit at the register transfer level. The non-synthesis RTL description file F3 is described in hardware description language such as Verilog-HDL language.

Next, an operation example of the circuit connecting unit 3 will be described. FIG. 7A shows a description example of the setting file F2, and FIG. 7B shows a description example of the non-synthesis RTL description file F3. FIG. 8 is a description example of the target RTL description file F10.

The setting file F2 is described in the same unit as that of a module described in the target RTL description file F10. Specifically, terminal information (input/output) for creating terminals other than the terminal of the module described in the operation description file F1, instance information (instance) for calling the module of the RTL circuit described in the non-synthesis RTL description file F3, and connecting information (wire/output) for connecting signals are described in the setting file F2.

The circuit connecting unit 3 adds a terminal to a module based on the terminal information and adds an instance to a module based on the instance information. An RTL description z1 is a terminal description added based on terminal information y1, and an RTL description z3 is an instance description added based on instance information y2. Other terminal description and instance description are created from the main circuit database DB1.

Next, based on connecting information y3, the circuit connecting unit 3 connects the added terminal or a pin of the added instance with the signal of the first RTL circuit that exists in the main circuit database DB1. The connection description of the pin in the instance description of the RTL description z3 is set based on the connecting information y3.

The circuit connecting unit 3 determines the bit width of the added terminal z1 based on the bit widths of the signal of the main circuit database DB1 and the signal of the non-synthesis RTL description file F3. The bit width of the added terminal z1 is determined based on the bit width of wiring z2 created for the connection between signals and the terminal information of the setting file F2.

As described above, in the high-level synthesis device according to the present embodiment, by using the control circuit designed by the user, an RTL description that satisfies the required performance can be created without changing the operation level description. Thus, even when correction is manually added to the RTL circuit created by high-synthesis, description errors can be reduced.

Third Embodiment

FIG. 9 is a block diagram of a high-level synthesis device according to a third embodiment of the present invention. In FIG. 9, the same reference numerals are assigned to the same components as those in FIG. 1 of the first embodiment.

A high-level synthesis device A3 includes a high-level synthesis unit 1, a circuit creating unit 2, a circuit connecting unit 3, and a waveform displaying unit 4. The high-level synthesis unit 1 creates a first RTL circuit from an operation description file F1 and stores the same in a main circuit database DB1. The circuit creating unit 2 creates a second RTL circuit from a setting file F2 and stores the same in a sub-circuit database DB2. The circuit connecting unit 3 creates a target RTL description file F10 in accordance with a connecting method described in the setting file F2. Specifically, the circuit connecting unit 3 creates the target RTL description file F10 based on the first RTL circuit of the main circuit database DB1 and the second RTL circuit of the sub-circuit database DB2. The waveform displaying unit 4 creates and displays the waveform of each signal from the scheduling result of the high-level synthesis unit 1 and the setting file F2.

Next, an operation example of the waveform displaying unit 4 will be described with reference to FIG. 10. FIG. 10 is a block diagram of the waveform displaying unit 4. The waveform displaying unit 4 includes an input value setting unit 41, a scheduling result extracting unit 42, a waveform adding unit 43, and a display unit 44. The input value setting unit 41 inputs an input signal value of the operation description file F1. The scheduling result extracting unit 42 extracts a transition timing of each signal from the scheduling result of the high-level synthesis unit 1 and then stores the extracted transition timing in the waveform database DB3. The waveform adding unit 43 calculates the transition timing of the signal newly defined in the setting file F2 and stores the same in the waveform database DB3. The display unit 44 displays the information of the waveform database DB3 on a screen.

First, a value required for calculating the transition timing of the signal is set with the input value setting unit 41 by the user. For example, in a case of the operation description file F1, setting of the value of a signal "n" is required, because the transition timing of the signal is changed by the signal "n".

Next, the scheduling result extracting unit 42 extracts the timing at which the signal described in the operation description file F1 makes a transition and the timing at which start/end signals of the control circuit created by the high-level synthesis unit 1 makes a transition, and stores the extracted results in the waveform database DB3.

Next, the waveform adding unit 43 acquires the transition timing of the signal referred to by a delay circuit described in the setting file F2 from the waveform database DB3, and based on the transition timing of the signal, calculates the transition timing of the output signal of the delay circuit and stores the calculated result in the waveform database DB3.

Finally, the display unit 44 displays on its screen a waveform image obtained by superimposing the waveform created by the scheduling result extracting unit 42 on the waveform created by the waveform adding unit 43.

FIG. 11 shows an example of a screen displaying the operation description file F1 in the case where the value of the signal "n" is 4, where a waveform w1 is the waveform created by the scheduling result extracting unit 42, and a waveform w2 is the waveform created by the waveform adding unit 43. In the display of these waveforms, the signal of one bit is displayed as a waveform showing transition of a signal value 0 and a signal value 1, and the signal of any bit other than one bit is displayed as a waveform showing the time at which the signal value changes.

As described above, in the high-level synthesis device according to the present embodiment, a transition relation between the signal of the circuit created by high-level synthesis and the signal of the circuit designed by the user can be confirmed on the screen; therefore, it is possible to confirm whether the information inputted by the user is information by which a circuit that performs operation as intended can be created.

FIG. 12 is a flowchart showing processing procedures of a high-level synthesis method according to the present embodiment. First, in high-level synthesis step S1, the high-level synthesis unit 1 performs high-level synthesis on the operation description file F1 and stores the obtained first RTL circuit in the main circuit database DB1.

Next, in performance confirmation step S2, the user views the display of the waveform displaying unit 4, confirms the transition timing of each signal, and confirms whether processing is completed with the number of cycles required for processing performance.

In step S2, when it is confirmed that the processing performance does not satisfy the requirement, in setting file input step S3, processing (for example, input prompting display processing) of prompting the user to perform input operation of the circuit configuration having the processing performance that satisfies the requirement is executed, and when it is confirmed that the user inputs the circuit configuration in response to the prompting, the description processing of the setting file F2 is executed according to the inputted circuit configuration. In performance confirmation step S4, the described setting file F2 and the high-level synthesis result are referred to, and the reference result is displayed on the waveform displaying unit 4 in the waveform shown in FIG. 11. The user views the display of the waveform displaying unit 4 and performs confirmation of the processing performance. When the user performs the confirmation of the processing performance to input completion of the confirmation, in circuit creation step S5, in response thereto, the circuit creating unit 2 creates the second RTL circuit based on the setting file F2 and stores the created second RTL circuit in the sub-circuit database DB2. Finally, in circuit connection step S6, the circuit connecting unit 3 connects the first RTL circuit stored in the main circuit database DB1 with the second RTL circuit stored in the sub-circuit database DB2 based on the setting file F2. In this manner, the target RTL description file F10 can be obtained.

As described above, in the high-level synthesis method according to the present embodiment, the user can perform design while confirming the operation of the RTL circuit created by the circuit information inputted by the user; therefore, the RTL circuit that satisfies the required performance can be created while input errors of the circuit information being prevented.

While most preferable specific examples of the present invention have been described in detail, various changes and modifications of the combination and arrangement of the components for the preferred embodiments can be made without departing from the spirit and scope of the appended claims of the present invention.

What is claimed is:
1. A high-level synthesis device comprising
a high-level synthesis unit that creates a first register transfer level circuit from an operation level description;
a circuit creating unit that creates a second register transfer level circuit based on circuit information for creating an additional circuit to be added to the first register transfer level circuit; and
a circuit connecting unit that connects the first register transfer level circuit with the second register transfer lever circuit, based on connecting information describing a connecting relation between a signal in the first register transfer level circuit and a signal in the second register transfer level circuit,
wherein the high-level synthesis unit calculates a delay amount of a delay circuit depending on a scheduling result of high-level synthesis, and wherein the circuit creating unit creates the delay circuit in the second register transfer level circuit using the delay amount.

2. The high-level synthesis device according to claim 1, wherein a signal referred to in the connecting information by the circuit connecting unit is a signal that exists in the operation level description.

3. The high-level synthesis device according to claim 1, wherein a signal referred to in the connecting information by the circuit connecting unit is input/output signals of a control circuit to be created by the high-level synthesis unit.

4. The high-level synthesis device according to claim 1, wherein a signal referred to in the connecting information by the circuit connecting unit is a control signal of a selector to be created in association with resource sharing in the high-level synthesis unit.

5. The high-level synthesis device according to claim 1, wherein the delay amount is a value calculated from a delay amount between prescribed signals of the first register transfer level circuit.

6. The high-level synthesis device according to claim 1, wherein the delay amount is described as a function in the circuit information and a value of the delay amount is calculated after the first register transfer level circuit is created.

7. A high-level synthesis device comprising
a high-level synthesis unit that creates a first register transfer level circuit from an operation level description; and
a circuit connecting unit that connects the first register transfer level circuit with a second register transfer level circuit, based on connecting information describing a connecting relation between a signal in the first register transfer level circuit and a signal in the second register transfer level circuit that is different from the first register transfer level circuit,
wherein the high-level synthesis unit calculates a bit width of signal wiring for the connection between the first register transfer level circuit and the second register transfer level circuit depending on a scheduling result of high-level synthesis, and
wherein the circuit connecting unit connects the first register transfer level circuit and the second register transfer level circuit by the signal wiring with said bit width.

8. The high-level synthesis device according to claim 7, wherein a signal referred to in the connecting information by the circuit connecting unit is a signal that exists in the operation level description.

9. The high-level synthesis device according to claim 7, wherein a signal referred to in the connecting information by the circuit connecting unit is input/output signals of a control circuit to be created by the high-level synthesis unit.

10. The high-level synthesis device according to claim 7, wherein a signal referred to in the connecting information by the circuit connecting unit is a control signal of a selector to be created in association with resource sharing in the high-level synthesis unit.

11. The high-level synthesis device according to claim 1, further comprising:
a waveform displaying unit that creates and displays a signal transition waveform based on a value of a signal inputted in the first register transfer level circuit, a scheduling result of the high-level synthesis unit, and the circuit information.

12. A method for high-level synthesis performed by a high-level synthesis device, said method comprising the steps of:
creating a first register transfer level circuit from an operation level description;
determining whether the first register transfer level circuit satisfies prescribed required performance;
receiving input of circuit information for creating an additional circuit to be added to the first register transfer level circuit to satisfy the required performance and connecting information describing a connecting relation between signals in the first register transfer level circuit including the additional circuit, in a case where it is determined that the first register transfer level circuit does not satisfy the required performance;
determining whether the first register transfer level circuit including the additional circuit satisfies the required performance, by referring to the first register transfer level circuit and the circuit information;
creating a second register transfer level circuit based on the circuit information, in a case where it is determined that the first register transfer level circuit including the additional circuit satisfies the required performance; and
creating a target register transfer level circuit by connecting the first register transfer level circuit with the second register transfer level circuit, based on the connecting information,
wherein a delay amount of a delay circuit is calculated depending on a scheduling result of high-level synthesis,
the delay circuit in the second register transfer level circuit is created using the delay amount,
a bit width of signal wiring for the connection between the first register transfer level circuit and the second register transfer level circuit is calculated depending on the scheduling result of high-level synthesis, and
the first register transfer level circuit and the second register transfer level circuit are connected by the signal wiring with said bit width.

13. The method for high-level synthesis according to claim 12, wherein the delay amount is described as a function in the circuit information and a value of the delay amount is calculated after the first register transfer level circuit is created.

14. The high-level synthesis device according to claim 7, further comprising:
a waveform displaying unit that creates and displays a signal transition waveform based on a value of a signal inputted in the first register transfer level circuit, a scheduling result of the high-level synthesis unit, and the circuit information.

* * * * *